United States Patent [19]

Butcher

[11] Patent Number: 4,847,870
[45] Date of Patent: Jul. 11, 1989

[54] HIGH RESOLUTION DIGITAL PHASE-LOCK LOOP CIRCUIT

[75] Inventor: James S. Butcher, Phoenix, Ariz.

[73] Assignee: Siemens Transmission Systems, Inc., Phoenix, Ariz.

[21] Appl. No.: 125,523

[22] Filed: Nov. 25, 1987

[51] Int. Cl.$^4$ .............................................. H03D 3/22
[52] U.S. Cl. ...................................... 375/87; 328/155; 375/110; 375/120
[58] Field of Search ............... 375/110, 118, 119, 120, 375/81, 87; 329/50, 122; 328/133, 134, 155

[56] References Cited

U.S. PATENT DOCUMENTS

| | | | |
|---|---|---|---|
| 3,238,459 | 3/1966 | Landee | 375/119 |
| 3,585,298 | 6/1971 | Liberman | 375/119 |
| 3,646,452 | 2/1972 | Horowitz et al. | 328/63 |
| 3,697,689 | 10/1972 | Gibson | 375/119 |
| 3,777,272 | 12/1973 | Fletcher et al. | 329/104 |
| 3,819,853 | 6/1974 | Stein | 375/118 |
| 4,288,874 | 9/1981 | Yamada | 375/118 |
| 4,385,396 | 5/1983 | Norton | 375/120 |
| 4,400,817 | 8/1983 | Sumner | 375/119 |
| 4,617,679 | 10/1986 | Brooks | 375/120 |
| 4,680,780 | 7/1987 | Aqoston et al. | 375/120 |

OTHER PUBLICATIONS

Publication from IEEE Transactions, entitled "Timing Recovery in Digital Subscriber Loops"; vol., Com-33, No. 6, Jun. 1985; pp. 558-569.
Publication from IEEE Transactions, entitled "Timing Jitter Effects on Digital Subscriber Loop Echo Cancellers: Part I"; vol. Com-33, No. 8, Aug. 1985; pp. 826-832.
Publication from IEEE Transactions, entitled "Timing Jitter Effects on Digital Subscriber Loop Echo Cancellers: Part II"; vol. Com-33, No. 8, Aug. 1985; pp. 833-838
Publication from IEEE Journal on Selected Areas, entitled "Timing Recovery in Digital Subscriber Loops Using Baud-Rate Sampling"; vol. Sac-4, No. 8, Nov. 1986; pp. 1302-1311.
Publication from IEEE Transactions, entitled "Asynchronous and Timing Jitter Insensitive Data Echo Cancellation"; vol. Com-34, No. 12, Dec. 1986; pp. 1209-1217.
Publication from NEC; No. PD9306/A; pp. 2-4, Oct. 1987.

Primary Examiner—Benedict V. Safourek
Attorney, Agent, or Firm—Jeffrey P. Morris

[57] ABSTRACT

A high resolution digital phase-lock loop circuit is described, which is implemented with an input clock reference frequency which is approximately the same as the output frequency of the phase-lock loop. The output is derived from delaying the input clock a variable number of gate delays ranging from no delay to one period of the input clock. A shift register controls the number of gate delays and a 360 degree phase detector initializes the shift register when the output is delayed by one period of the input clock to provide no delay. Gate delay variations due to integrated circuit process, voltage and temperature are compensated for to provide a relatively constant clock phase correction.

19 Claims, 5 Drawing Sheets

FIG. 3   HADPCC

FIG. 5
360 DEG RETARD TIMING d = don't care

FIG. 7
CLK CORRECT CONTROL 12B
(WITH GATE DELAY COMPENSATION)

HIGH RESOLUTION DIGITAL PHASE-LOCK LOOP CIRCUIT

BACKGROUND OF THE INVENTION

1. Field of the Invention

The present invention relates generally to an improved means of implementing a digital phase-lock loop for replacing analog phase-lock loops which use voltage controlled or tuned tank oscillators. The invention also describes a very low jitter IC clock recovery circuit for an Integrated System Digital Network two wire bidirectional interface between a telephone central office line terminal and subscriber network terminals, called the ISDN U interface receiver. The invention is generally applicable to high and low speed transmission multiplexers and subscriber line interface circuits (SLIC's), and to data communications generally.

2. Description of the Prior Art

In the known prior art, digital phase-lock loops required a much higher input clock reference frequency than the desired output frequency to allow small clock phase adjustments to be made at the output. The input clock is divided down to the required output frequency which can be phase corrected by a minimum of one input clock period. Typically, a prior art digital phase-lock loop used in a data clock recovery circuit requires an input reference frequency 10 to 100 times the output clock frequency to provide the desired receiver signal-to-noise performance. For example, a low speed optical fiber DS2 receiver with a 13.056 Mhz Manchester data sampling clock would require an input reference frequency of 208.9 Mhz (16 times the sampling clock frequency) to provide +/−4.8 nsec sampling resolution. In a special application, such as an ISDN U interface echo cancelling clock recovery circuit for 80 kbps, 2B1Q data, a minimum input clock reference frequency of 1000 times the bit rate (80 Mhz) is required to provide adequate cancellation of the transmitted signal and the return echo. The 2B1Q data is a well known format representing 2 binary 1 quaternary wherein two bits are mapped into one baud, with each baud period of 12.5 microseconds containing a four level signal. Manchester encoding is also well known and is accomplished by representing a logic "1" with a (+) followed by a (−), and a logic "0" with a (−) followed by a (+).

There are disadvantages to the aforementioned prior art technique in using high (>25 Mhz) instead of low (<25 Mhz) frequency reference clocks for digital phase-lock loops. The high speed interface circuitry required is more costly, it consumes more power, and it generates more radio frequency interference (RFI). Furthermore, the crystals used for the high frequency reference do not operate in the fundamental mode but rather in harmonic modes and consequently are less efficient and more costly than crystals operating in the fundamental mode. High frequency crystals are also more susceptible to frequency drift due to stray capacitance and humidity. Because of these stability problems, an analog VCO or tuned tank oscillator is generally used in such high frequency applications even though such analog components require initial adjustment or trimming and drift with temperature.

Digital phase-lock loop circuitry is generally well known in the prior art, as exemplified by U.S. Pat. No. 3,585,298, Timing Recovery Circuit with Two Speed Phase Correction; U.S. Pat. No. 3,646,452, Second Order Digital Phase-Lock Loop; U.S. Pat. No. 3,697,689, Fine Timing Recovery System; U.S. Pat. No. 3,777,272, Digital Second-Order Phase-Locked Loop; U.S. Pat. No. 4,288,874, Timing Data Reproduction System; and U.S. Pat. No. 4,400,817, Method and Means of Clock Recovery in a Received Stream of Digital Data.

A further example of the prior art is the digital phase-lock loop used in the NEC uPD9306/A CMOS hard-disk interface IC. This integrated circuit is described in the NEC Microcomputer Products 1987 Data Book Vol. 2 of 2, pages 6-125, 6-126 and 6-127. A delay line with ten 10 nsec taps is required for the described NEC IC, which is not as cost effective as the present invention and does not provide the resolution possible with the present invention, as ten external leads from the delay line must interface the NEC IC.

In contradistinction to the disadvantages of the prior art described by way of example above, the present invention allows the use of an input frequency which is approximately equal to the desired output frequency while yielding output clock phase adjustments as small as two NAND gate propagation delays. For 2 micron CMOS, this is about 4 nsec, which is equivalent to a 250 Mhz reference clock with a conventional digital phase-lock loop. A DS2 Manchester data receiver using the present invention requires only a 13.056 Mhz crystal to provide 4 nsec phase adjustments. An ISDN U interface clock recovery circuit could use a 10.24 Mhz crystal to also provide 4 nsec phase adjustments (1/3125th of a bit period). A 10.24 Mhz phase corrected output is divided by 128 to derive an 80 Khz receive clock. The 10.24 Mhz clock is also used to drive digital signal processing hardware.

There are numerous applications of the present invention, including low speed fiber optic and ISDN clock recovery circuits, and high speed fiber optic data and clock recovery circuits using high speed IC technology. For example, a 500 Mbit/sec NRZ data and clock recovery circuit could be implemented using a 500 Mhz clock reference input to a gallium arsenide IC implementation of the invention. An on-chip 100 psec selector delay would provide a resolution of 20 samples per bit. A prior art digital phase-lock loop would require a very high 10 Ghz clock reference input, instead of the much lower frequency of the present invention.

The present invention is advantageously applicable wherever a digital phase-lock loop can be used, but without the requirement of the prior art for a high frequency reference.

The present invention can also be used to implement a delay line with delay based on a clock reference. The delay is established by a programmable percentage of the average phase retard count. Integrated circuit process delay variations are compensated for upon initialization, but periodic calibration cycles are required to compensate for temperature and voltage changes.

SUMMARY OF THE INVENTION

A high resolution digital phase-lock loop circuit is provided having an input clock reference frequency which is approximately the same as the output frequency. The output of the circuit is derived by delaying the input clock a variable number of gate delays ranging from no delay to a one period delay of the input clock. A shift register controls the number of gate delays and a 360 degree phase detector initializes the shift register when the circuit output is delayed by one period of the input clock to provide no delay. Gate delay variations due to integrated circuit process, voltage and temperature are compensated for to provide a relatively constant clock phase correction.

It is therefore an object of the invention to utilize the propagation delay time of a serial chain of data selectors to provide a variable delay.

Another object of the invention is to provide a pair of logical 1's in a shift register to control the data selectors and prevent errors in the delayed output.

Another object of the invention is to provide a gate delay compensation circuit which indirectly measures and then compensates for gate delay variations due to process, voltage and temperature.

Another object of the invention is to provide a mode control circuit to control the correction bandwidth.

Another object of the invention is to provide a 0 degree and 180 degree inhibit circuit to inhibit false 360 degree detects.

Another object of the invention is to provide a slightly higher input than output frequency clock to allow continuous phase retards to occur which quickly updates the average phase retard counter over voltage and temperature changes. This technique allows a complete shift register reset every clock period of correction to recover from undesired states, and simplifies the 180 degree inhibit circuitry.

The foregoing and other objects and advantages of the invention will become apparent with reference to the following detailed description of a preferred embodiment and to the accompanying drawings, wherein:

DESCRIPTION OF THE PREFERRED EMBODIMENT

Figure 1:
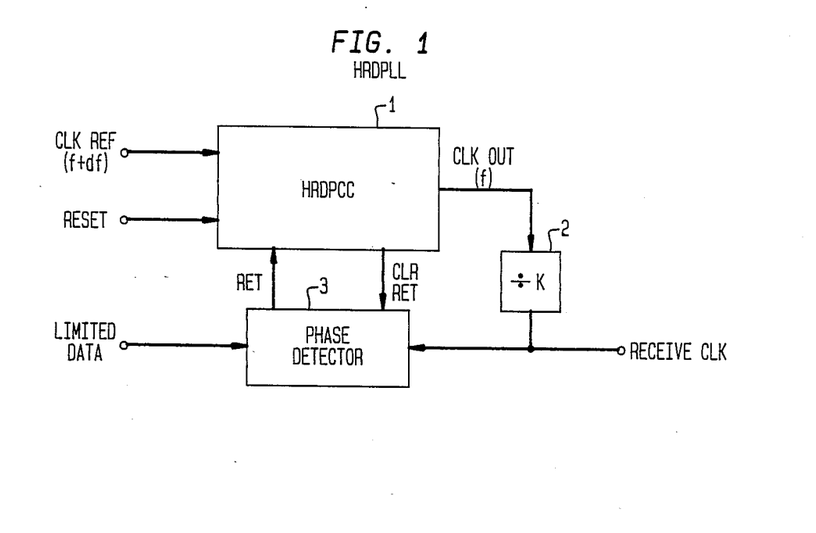
FIG. 1 is a block diagram of a high resolution digital phase-lock loop in accordance with the present invention.

FIG. 1 shows a block diagram of the digital phase-lock loop of the present invention in a clock recovery circuit implementation. The circuit consists of a high resolution digital phase correction circuit 1, a divide by K circuit 2, a phase detector 3. The correction circuit 1 generates a CLK OUT signal (f) which is divided by K (K≧1) in frequency to produce a RECEIVE CLK phase locked to the data transitions of a LIMITED DATA input.

The clock reference input (CLK REF) to the phase correction circuit 1 is slightly higher (typically 30 to 300 ppm) in frequency than the transmit clock frequency of the LIMITED DATA input, and is shown as f+df. In this example only retard phase corrections are required to maintain phase-lock to the LIMITED DATA signal transitions. The phase detector 3 generates a phase retard signal (RET) whenever the RECEIVE CLK is too early relative to the LIMITED DATA signal transitions. Each RET signal causes the phase-lock loop to introduce a fixed delay of CLK OUT (f) and then to output a clear retard signal (CLR RET) which resets the phase detector 3 RET output. The fixed delay retard correction is in integer multiples of the propagation delay of two NAND gates, described hereinafter in greater detail. A RESET input to the correction circuit is used for initialization.

Figure 2:
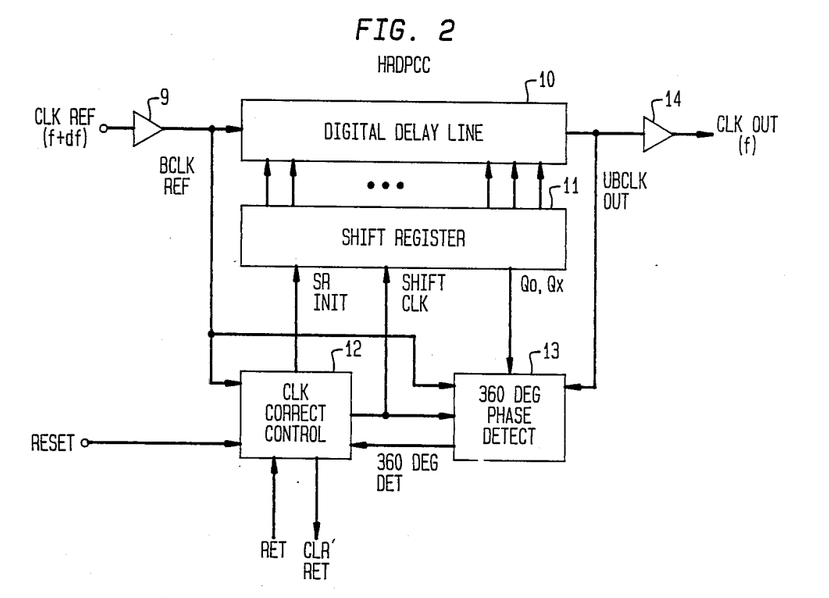
FIG. 2 is a block diagram of a high resolution digital phase correction circuit used with the circuit of FIG. 1.

FIG. 2 shows a block diagram of the high resolution digital phase correction circuit 1. A digital delay line 10 provides an incremental delay from 0 to 360 degrees of the CLK REF period. Shift register 11 selects the number of two NAND gate delays from 0 to n, where n is greater then the CLK REF period divided by the worst case minimum two NAND gate delay. Clock correct control 12 provides a SHIFT CLK signal to the shift register 11 based on the RET input signal. In the high resolution mode, each retard request produces only one shift clock edge and delays the CLK OUT signal by an additional two NAND gate delay.

The 360 degree phase detect circuit 13 outputs a 360 DEG DETECT signal to the clock correct control 12 when CLK OUT has been retarded by 360 degrees of the CLK REF period. This generates a shift register 11 initialization signal (SR INIT) which establishes zero delay in the digital delay line 10. Thus, even though the digital delay line 10 only provides up to one CLK REF period of actual delay, it appears as an infinite delay line at CLK OUT. This allows continuous phase retard requests to generate a CLK OUT frequency which is lower than the input CLK REF frequency and has a peak jitter of about two NAND gate delays. The 360 degree phase detector uses the Qo and Qx taps of the shift register 11 to prevent false 360 degree phase detects for x-1 shift clocks after SR INIT occurs.

The RESET input initializes the clock correct control 12 which outputs an SR INIT signal to the shift register 11. Buffer amplifier 9 provides a buffered clock reference (BCLK REF) which is primarily required to drive the digital delay line 10. Buffer amplifier 14 isolates the digital delay line 10 output (UBCLK OUT) and provides drive capability for the CLK OUT (f) signal.

Figure 3:
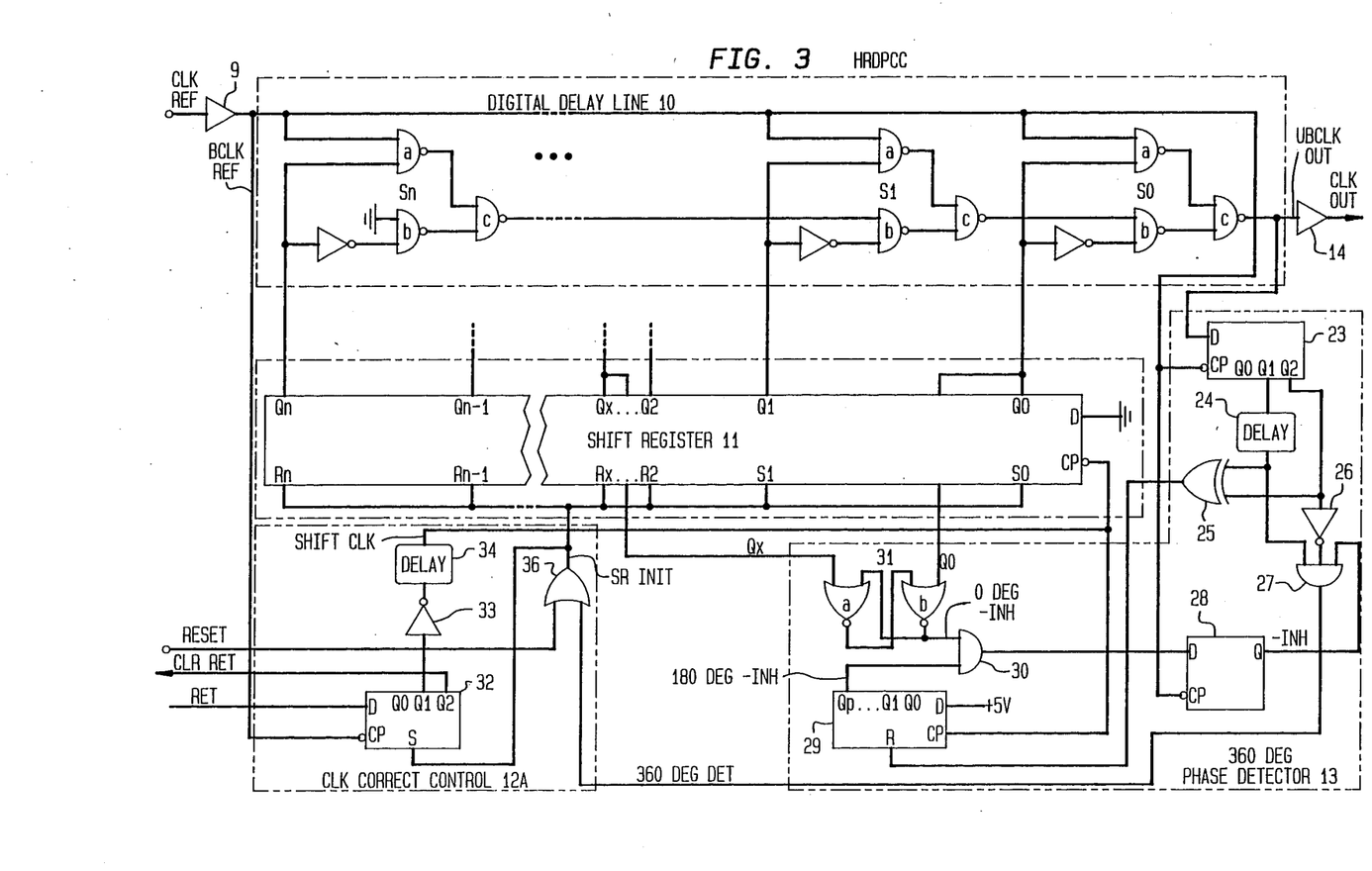
FIG. 3 is a circuit schematic of the high resolution digital phase correction circuit of FIG. 2.

FIG. 3 shows a detailed circuit implementation of the digital phase correction circuit 1. The digital delay line 10 is implemented using a serial chain of 1 of 2 data selectors (SO-Sn). The data selectors can be implemented with logic NAND gates as shown or with an equivalent such as logic AND-OR gates. The number of data selectors, n (not including SO), must be greater than the CLK REF period divided by the worst case minimum selector propagation delay (gates a & c). The Q outputs of shift register 11 control the selectors of the digital delay line 10.

The 360 degree phase detector 13 consists of a 360 degree positive edge detector composed of elements 23, 24, 26 and 27; and an inhibit circuit which prevents false 360 degree phase detects. The inhibit circuit consists of a 0 DEG inhibit circuit comprised of elements 31, 30 and 28; and a 180 DEG inhibit circuit, comprised of elements 25, 29, 30 and 28.

Figure 4:
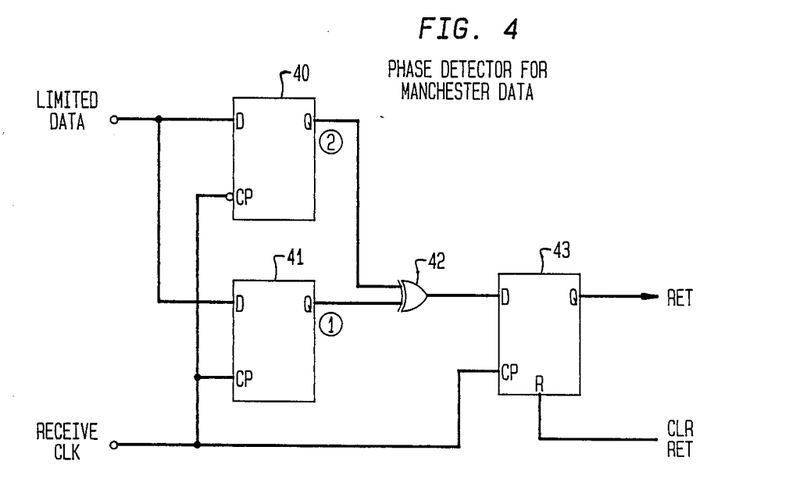
FIG. 4 is a circuit schematic of a phase detector for use with Manchester encoded data.

The clock correct control circuit 12A consists of a shift clock circuit, including elements 32, 33 and 34, which provides an asynchronous retard signal interface to a limited data phase detector 3 via the RET and CLR RET signals. FIG. 4, which will be described later, shows an example of a phase detector for Manchester encoded data. OR gate 35 allows shift registers 11 and 32 to be initialized via the SR INIT signal by either an external RESET signal or the 360 DEG DET signal from the 360 DEG PHASE DETECTOR 13.

Figure 5:
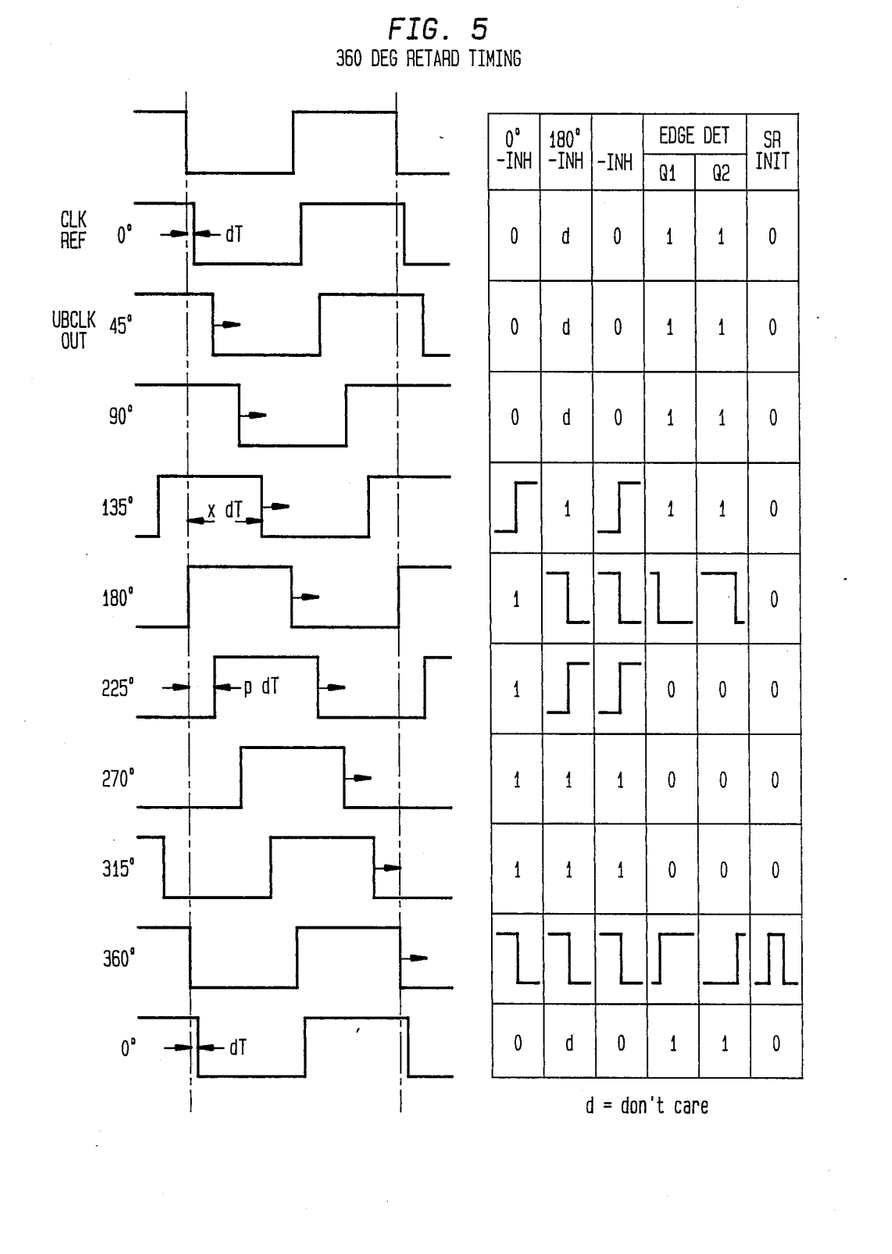
FIG. 5 is a series of waveform diagrams useful in explaining the phase retard timing in accordance with the present invention.

The reset state, phase retard corrections from 0 to 180 degrees and phase retard corrections from 180 to 360 degrees of the digital phase correction circuit 1 will now be described. FIG. 5 shows 360 degree phase retard timing waveforms for this circuit 1.

If a reset pulse is applied to the phase correction circuit 1 via the RESET input, SR INIT pulses logic high to initialize the shift register 11 outputs to all logic 0's except for Q0 and Q1 which are set to logic 1. The clock correct control shift register 32 is also set to all 1's. In the reset state the digital delay line 10 output (UBCLK OUT) is just the BCLK REF signal delayed by the a and c NAND gates of selector S0. This is the zero degree phase reference of the UBCLK OUT signal for the 360 degree phase detector circuit 13.

Edge detector shift register 23 samples the UBCLK OUT signal at its D input on the falling edge of the BCLK REF signal. In the reset condition, the edge detector typically samples the digital delay line 10 output just before a falling edge. The shift register 23 thus typically contains all 1's, but due to worst case integrated circuit propagation delays, all 0's or sporadic 0's and 1's could occur.

The 0 DEG-INH output of RS latch 31 is low since Q0=1 and Qx=0. This forces the −INH lead low via AND gate 30 and D flip-flop 28 after a negative edge of BCLK REF. The 360 DEG DET lead is also forced low via AND gate 27. Thus, SR INIT is inhibited from pulsing high even if the edge detector detects positive edges. The state of the 180 DEG-INH lead is typically low, but is a "don't care" state since the output of AND gate 30 is forced low by the 0 DEG-INH lead.

Shift register 32 is set by the reset pulse on the RESET input via OR gate 35. This forces SHIFT CLK low which has no affect on shift register 11 since SR INIT is high at this time. CLR RET is also high which resets flip-flop 43 of phase detector of FIG. 4. Two negative BCLK REF edges after the RESET input goes low, the SHIFT CLK goes high. Three negative BCLK REF edges after the RESET input goes low, the CLR RET goes low which removes the reset on flip-flop 43 shown in FIG. 4. The clock correct control circuit 12A is now in the idle state, ready to receive phase retard clock corrections.

The phase retard corrections 0 to 180 degrees described with reference to FIG. 3 will now be explained. When a high phase retard signal is received on the RET input from phase detector 3, Q1 of shift register 32 pulses high for 3 periods of BCLK REF after a one period delay. On the leading edge of this pulse, a negative edge occurs at the SHIFT CLK signal via inverter 33 and delay 34. This shifts the pair of logic 1's in shift register 11 at Q0 and Q1 to Q1 and Q2, and a 0 into Qo which causes selector S1 to insert a two-NAND gate delay (a and c) of dT in the digital delay line path from CLK REF to CLK OUT. All following rising and falling edges of CLK OUT will thus be delayed by an additional time dT.

The Q0 output of shift register 32 is not used to allow metastable states to settle to a valid logic level during one BCLK REF period. A metastable state can occur due to asynchronous sampling of the RET signal by the negative edge of the BCLK REF signal. The RET signal transitions occur on RECEIVE CLK edges coupled to flip-flop 43 in FIG. 4, which are based on CLK OUT timing. CLK OUT edges are asynchronous to BCLK REF edges due to the incremental delay introduced by the digital delay line 10. A metastable state could potentially cause shift register 11 clocking to be delayed such that an error may occur at CLK OUT.

Errors in the CLK OUT signal are avoided during insertion of the dT delay by not changing the Q0 output of shift register 11 from 1 to 0 until both selector S0 inputs are at 0. This occurs after the BCLK REF high to low transition propagates through the two NAND gates (a and c) of selector S1. The delay 34 value is chosen so that this condition is guaranteed under worst case conditions. The delay, if required, can be implemented with inverters or gates. The leftmost logic 1 of the shifted pair of logic 1's which was at Q1 before the shift, and now is at Q2, sets up the two-NAND gate (a and c) delay path which will be inserted upon each shift and completely isolates the digital delay line output from the left.

Each new phase retard request received, causes the pair of logic one's in shift register 11 to shift left one position which adds an additional time dT delay to the CLK OUT signal. When Qx goes high, the RS latch 31 is reset and the 0 DEG-INH line goes high. The output of AND gate 30 then goes high since the 180 DEG-INH line is high. After one CLK REF period -INH goes high which enables the 360 degree detector.

The Qx tap point is chosen to inhibit a positive edge detect which otherwise might occur near 0-degree phase and cause an SR INIT before 360 degree phase delay is reached. The worst case maximum selector propagation delays, determine the Q output where 360 degree phase delay is selected. Qx is chosen to be approximately two taps before this tap. This ensures that the 0-degree inhibit circuit will never mask valid 360 degree detects. The 0-degree inhibit function can overlap with the 180-degree inhibit function and normally will do so with worst case maximum selector delays.

Until the CLK OUT signal is delayed by 180 degrees with respect to the BCLK REF, the edge detector shift register 23 will sample logic 1's and Q0=Q1=Q2=1. When 180-degree phase delay occurs, logic 0's will be sampled and EX-OR gate 25 will output a high pulse and reset shift register 29. This causes the -INH line to go low on the next falling edge of BCLK REF which inhibits positive edge detects via AND gate 27. Positive edge detects are inhibited for at least the next p SHIFT CLK's.

The 180 degree inhibit function inhibits positive edges which look like 360 degree phase detect edges e.g. Q1=1, Q2=0, from causing a false SR INIT signal at 180-degrees instead of at 360 degrees delay. If jitter is present on the CLK REF line or if gate propagation delays vary, edges will be detected by the edge detector and cause another reset of shift register 29. The 180 degree inhibit is removed (p+1) SHIFT CLK's after all all 0's are continuously sampled by the edge detector. The Qp tap of shift register 29 is chosen such that with worst case maximum selector delays and worst case duty cycle of BCLK REF, the Qp tap will go to logic 1 about two SHIFT CLKS before 360 degrees is detected. This ensures that the 180 degree inhibit function will never mask valid 360 degree detects.

As additional phase retard corrections occur and 360 degree phase delay is approached, the edge detector shift register 23 outputs are logic 0 and the 360 degree detector is enabled. When Q1 of shift register 23 goes to 1, a 360-degree delay has been detected. The Q1 logic low to logic high transition is delayed by delay 24 and forces SR INIT high via AND gate 27 and OR gate 35. Shift register 11 is initialized just as during reset with Q0=Q1=1 and Q2 through Qn=0. Q0 of shift register 11 sets the RS latch 31 forcing 0 DEG-INH low. The SR INIT line returns to low via AND gate 27 and OR gate 35 when flip-flop 28 samples the low output of AND gate 30. The phase correction circuit 1 has now completed a 0-to-360-and-back-to-0- degree phase cycle. The phase correction circuit 1 is now ready for additional retard requests.

The Q0 output of shift register 23 is not used to allow metastable states to settle out during one period of CLK REF. UBCLK OUT is asynchronous relative to the sampling clock, BCLK REF, due to the incremental delays of the digital delay line 10. A metastable state could potentially delay the SR INIT pulse to occur after BCLK REF returns high and cause an error in CLK OUT.

The delay 24 in 360-DEG phase detector 13 is not normally required, but is shown in FIG. 3 to indicate a critical timing path. In order to avoid errors on CLK OUT, the BCLK REF input at the NAND gates of selectors S1 and S0 must be low before the Q1 or Q0 outputs go high as a result of SR INIT pulsing high. The inherent worst case minimum delays of 23, 27, 35 and 11 typically provide an adequate total delay to compensate for maximum high-to-low transition time of BCLK REF, input threshold differences or layout variations.

An application of the present invention in a Manchester encoded clock recovery circuit will now be described, with reference to FIG. 4. Referring first to FIG. 1, 6.528 M bps limited encoded Manchester data is provided to phase detector 3. A 13.056 Mhz+150 ppm crystal (+/−50 ppm) is used to generate the CLK REF signal with a worst case duty cycle of 40-60%. The CLK OUT signal is divided by K=1 to yield the RECEIVE CLK. In FIG. 3, the typical selector delay provided by gates a and c is assumed as 4 nsec, +/−80% including IC process, temperature and voltage variations. The minimum and maximum selector delays are thus approximately 0.8 nsec and 7.2 nsec, respectively.

The number of selectors required is found by dividing the CLK REF period by the minimum selector delay or 76.593 nsec/0.8 nsec=95.7 selectors. By using 97 selectors, for safety, then n=97. The Qx tap is found by dividing the CLK REF period by the maximum selector delay and subtracting two for a safety margin. Thus, 76.593 nsec/7.2 nsec−2=10.6−2=8.6. Let Qx=Q8 for safety. The Qp tap is found by dividing the minimum half-period of BCLK REF by the maximum selector delay and subtracting two for a safety margin. Thus, (76.593 nsec×40%)/7.2 nsec−2=2.255. Thus Qp=Q2.

Figure 6:
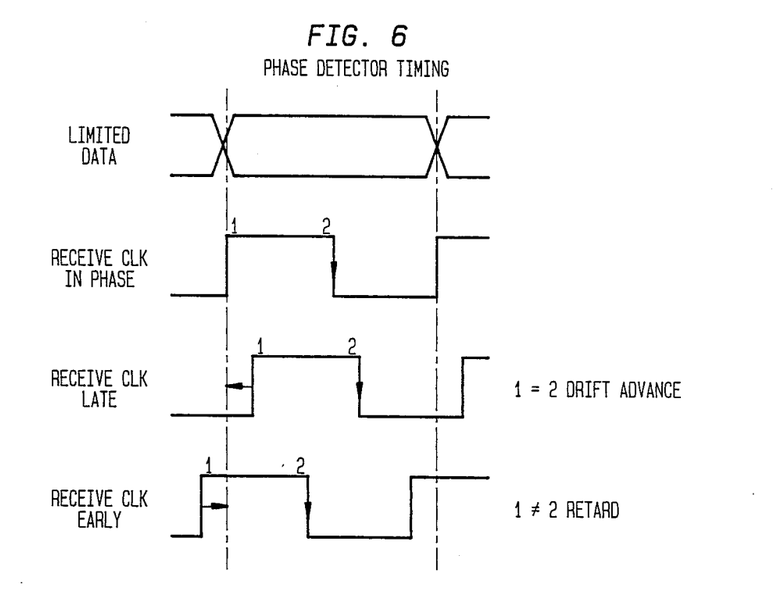
FIG. 6 is a series of waveform diagrams useful in explaining the phase detector timing in accordance with the present invention.

FIG. 4 shows a simple phase detector which attempts to center the negative edge of the RECEIVE CLK between limited data transitions. FIG. 6 shows the phase detector timing. Data flip-flops 40 and 41 sample LIMITED DATA on the negative (sample 2) and positive (sample 1) edges of the RECEIVE CLK, respectively. If the two flip-flop outputs 1 and 2 from flip-flop 41 and 40 are different, indicating a transition, then the EX-OR gate 42 output is high, otherwise it is low. The phase retard flip-flop 43 samples the EX-OR output on each positive edge of RECEIVE CLK assuming CLR RET is not high. If the RECEIVE CLK is late, samples 1 and 2 are the same and the receive clock drifts in the advance direction due to the +150 ppm high CLK REF frequency. If the RECEIVE CLK is early, samples 1 and 2 are different which generates phase retard requests to the phase correction circuit 1. The RECEIVE CLK is retarded in nominal 4 nsec increments until samples 1 and 2 are the same. This retard and advance action continuously occurs to maintain the negative edge of RECEIVE CLK approximately centered between limited data transitions. The shift register 11 of the phase correction circuit 1 will shift the pair of logic 1's to the left at an average rate which provides a RECEIVE CLK frequency which is locked to the incoming LIMITED DATA frequency. Shift register 11 will be initialized by SR INIT every 360-degrees of phase delay between the CLK REF and the CLK OUT signal.

The phase detector of FIG. 4 will not accurately center the RECEIVE CLK if the limited data transition region is not sharply defined due to poor signal-to-noise ratio. The negative edge of the RECEIVE CLK will be slightly late under this condition. The accuracy of center sampling is dependent on the duty cycle of CLK REF. With a 60-40% duty cycle a +/−10% sampling error can occur. The digital delay line 10 will not degrade the duty cycle of CLK REF at CLK OUT even if the NAND gate high-to-low and low-to-high Propagation delays are not equal. Since two NAND gates are used in each selector, each selector has a total delay equal to the low-to-high plus high-to-low propagation delays for either type of input transition. If very accurate center sampling is required, CLK OUT can be divided by 2(K=2) to eliminate any duty cycle inaccuracy. This, of course, doubles the required input frequency at CLK REF.

Figure 7:
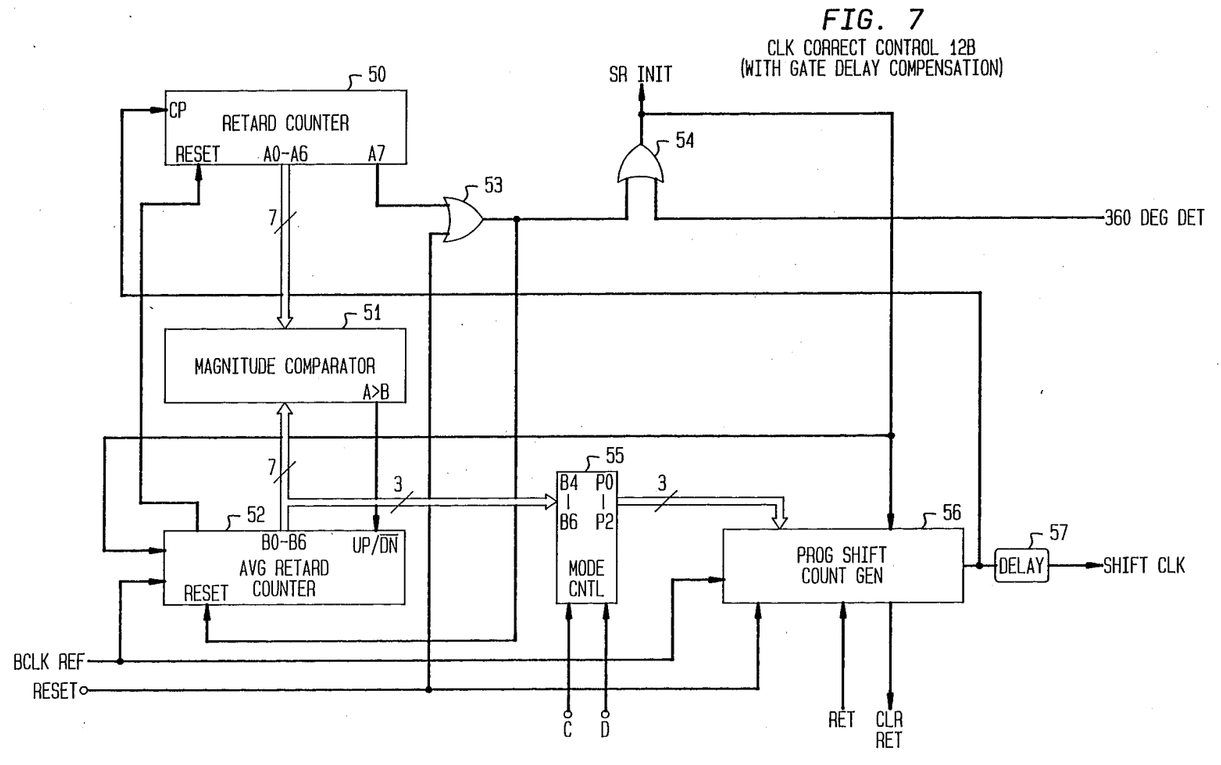
FIG. 7 is a block diagram of a clock correction control circuit in accordance with an aspect of the present invention.

FIG. 7 shows a block diagram of a clock correction control circuit 12B with gate delay compensation. The clock correct control circuit 12B can be used in place of the circuit 12A described with reference to FIG. 3 to provide the additional features of gate delay compensation, bandwidth mode control, and shift register 11 all zero's recovery.

Gate delay compensation reduces the worst case min-max dT correction range to 1:2 or better by using multiple dT corrections to build up the minimum dT correction. Bandwidth mode control allows control over the min-max correction range. Shift register 11 all zero's recovery prevents an all zero's lock-up state.

Gate delay compensation of the high resolution phase-lock loop is required in many applications to provide tighter tolerance phase retard correction. Since there is no high frequency reference to base each correction on, as in a conventional digital phase-lock loop, another approach must be taken. First the average selector propagation delay is determined by counting the number of retard shifts necessary to provide one CLK REF period delay. The average selector delay is then just the CLK REF period divided by this count. The desired minimum correction time is divided by this average selector delay to provide the number of dT corrections necessary to achieve this time. The minimum correction time must be greater than half the maximum dT correction. The worst case correction time accuracy covers a 1:2 min-max range regardless of the integrated circuit gate delay variation. The following equations summarize the above description and illustrate how the division operation can be simplified:

$$\frac{\text{CLK REF PERIOD}}{\text{AVG RET COUNT}} = \text{AVG SELECTOR DELAY} \quad \text{Eq. (1)}$$

$$\frac{\text{INT(MIN CORRECT TIME)}}{\text{AVG SELECTOR DELAY}} + 1 = \text{NO. OF dT CORRECTIONS} \quad \text{Eq. (2)}$$

Substituting Eq. (1) for the averge selector delay of Eq. (2):

$$\frac{\text{INT(MIN CORRECT TIME*AVG RET COUNT)}}{\text{(CLK REF PERIOD)}} + 1 = \text{NO. OF dT CORREC.} \quad \text{Eq. (3)}$$

INT(x/y) means the integer portion only of x/y after the division. To simplify the division implementation, the desired minimum correction time should be chosen to yield a ½**n result for MIN CORRECT TIME/CLK REF PERIOD in Eq. (3) where n is an integer. Simple binary division of AVG RET COUNT can then be performed by shifting left n times toward the most significant bit.

The block diagram of FIG. 7 illustrates a circuit for implementing a technique which uses binary division to compensate for gate delay variations. Average phase retard counter 52 holds the average number of shift clocks required to go from 0 to 360 degree delay. This up/down counter is incremented or decremented one count each time SR INIT occurs. Just before SR INIT occurs, the phase retard counter 50 count A is compared to the average phase retard counter count B by magnitude comparator 51. If A>B, then the average phase retard count is incremented, otherwise it is decremented. The three most significant bits of the average retard count (B6-B4) are provided to a mode control circuit 55. A binary divide-by-16 of B6-B0 is accomplished by using only B6-B4 which is equivalent to shifting left fours bits.

The mode control circuit maps B6-B4 to P2-P0 based on the C and D inputs. B6-B4 is passed straight through (CD=11), divided by 2(CD=10), divided by 4 (CD=01), or divided by 8(CD=00). Divide by 8 just results in P2=P1=P0=0 which is narrowband mode 0. The programmable shift count generator 56 translates the P2-P0 input to the appropriate number of shift clocks for each retard request. The binary count of P2-P0 plus 1 equals the number of shift clocks.

OR gate 53 outputs a logic high when either a reset or shift register 11 all zero's state (A7=1) occurs. This resets the average phase retard counter and generates an SR INIT via OR gate 54. A7 goes logic high after 128 shift clocks have occurred with no SR INIT signal. The only way this can occur is when shift register 11 contains all zero's.

The clock correct control circuit described with reference to FIG. 7 can be used in mode 0 for the Manchester clock recovery application described previously or in mode 3 for an ISDN echo cancelling clock recovery circuit to be described. The FIG. 7 circuit is based on a range of 0.8 to 7.2 nsec selector delays and a minimum CLK REF frequency of 10 Mhz. The counter sizes, mode control operation and programmable shift count generator can be easily adapted for other applications.

An ISDN U interface embodiment of the invention will now be described. A digital phase-lock loop clock recovery application for an ISDN U interface will further illustrate the technique used for gate delay compensation and mode control. As described hereinbefore with respect to FIG. 1, LIMITED DATA is actually transition information from the four level 2B1Q signal derived via three comparators. The phase detector 3 can be implemented with the simple circuit shown in FIG. 4.

To provide compatability with the previously described Manchester encoded data and the clock recovery circuit and also to provide operation over CLK REF frequencies of 10 Mhz to 15 Mhz, the number of selectors =127, Qx=Q7 and Qp=Q1.

An example of ISDN U interface clock recovery circuit design specifications are:

| ISDN U INTERFACE DESIGN EXAMPLE DATA | |
|---|---|
| Transmission | Echo canceller with hybrid |
| Line code | 2B1Q |
| Rcv baud rate | 80 K +/− 5 ppm |
| CLK REF freq (f + df) | 10.24 Mhz + 45 ppm (+/− 10 ppm) |
| CLK REF period | 97.652 nsec (40–60% duty cycle) |
| CLK OUT (f) | 10.24 Mhz +/− 5 ppm (when phase locked) |
| divide by K (FIG. 1) | K = 128 |
| RECEIVE CLK freq. | 80 Khz +/− 5 ppm |
| RECEIVE CLK period | 12.5 usec |
| 2 u CMOS selector delay | 4 nsec +/− 80% (0.8 nsec min, 7.2 nsec max) |
| Min. correction time | 6 nsec |

Substituting in the first fraction of Eq. (3):

$$\frac{\text{MIN CORRECT TIME}}{\text{CLK REF PERIOD}} = \frac{6 \text{ nsec}}{97.652 \text{ nsec}} = \frac{1}{16.2}$$

Approximate 1/16.2 with 1/16=½**4 to allow division to be implemented by a shift left 4x and substitute in Eq. (3):

Eq. (4) INT (1/16 * AVG RET COUNT)+1=NO. OF dT CORRECTIONS

Referring now to the accompanying tables, Table 1 shows the max and min average selector delay (dT), B6 B5 B4 and the no. of dT corrections for any average phase retard count from 0 to 127. This table is derived from Eq. (1) and Eq(4).

Tables 2A through 2D show B6 B5 B4, P2 P1 P0, the no. of shift clocks per phase retard request and the correct time for modes 0, 1, 2 and 3. Mode 0 is equivalent to clock correct control circuit 12A in FIG. 3 since only one shift clock is generated per phase retard request regardless of the average selector delay. The mode 0 correct time range is 0.769 to 7.2 nsec which is a 1:9.4 range. Modes 1 to 3 reduce the correction time range by increasing the minimum correction time, whereby:

| Mode 0 = | .769–7.2 nsec, | 1:9.4 |
|---|---|---|
| Mode 1 = | 1.538–7.2 nsec, | 1:4.7 |

-continued

| | | |
|---|---|---|
| Mode 2 = | 3.076–7.2 nsec, | 1:2.3 |
| Mode 3 = | 6.152–12.2 nsec, | 1:2 |

TABLE 1

| AVG RET COUNT | AVG SELECTOR DELAY MAX (ns) | AVG SELECTOR DELAY MIN (ns) | B6 | B5 | B4 | NO. OF dT CORRECTS |
|---|---|---|---|---|---|---|
| 0–15 | — | 6.510 | 0 | 0 | 0 | 1 |
| 16–31 | 6.100 | 3.150 | 0 | 0 | 1 | 2 |
| 32–47 | 3.052 | 2.078 | 0 | 1 | 0 | 3 |
| 48–63 | 2.035 | 1.550 | 0 | 1 | 1 | 4 |
| 64–79 | 1.526 | 1.236 | 1 | 0 | 0 | 5 |
| 80–95 | 1.221 | 1.028 | 1 | 0 | 1 | 6 |
| 96–111 | 1.017 | .880 | 1 | 1 | 0 | 7 |
| 112–127 | .872 | .769 | 1 | 1 | 1 | 8 |

TABLE 2

| B6 | B5 | B4 | P2 | P1 | P0 | SHIFT CLKS | CORRECT TIME MAX (ns) | CORRECT TIME MIN (ns) |
|---|---|---|---|---|---|---|---|---|
| (Mode 0, AB = 00) | | | | | | | | |
| 0 | 0 | 0 | 0 | 0 | 0 | 1 | (7.2) | 6.510 |
| 0 | 0 | 1 | 0 | 0 | 0 | 1 | 6.100 | 3.150 |
| 0 | 1 | 0 | 0 | 0 | 0 | 1 | 3.052 | 2.078 |
| 0 | 1 | 1 | 0 | 0 | 0 | 1 | 2.035 | 1.550 |
| 1 | 0 | 0 | 0 | 0 | 0 | 1 | 1.526 | 1.236 |
| 1 | 0 | 1 | 0 | 0 | 0 | 1 | 1.221 | 1.028 |
| 1 | 1 | 0 | 0 | 0 | 0 | 1 | 1.017 | .880 |
| 1 | 1 | 1 | 0 | 0 | 0 | 1 | .872 | .769 |
| (Mode 1, AB = 01) | | | | | | | | |
| 0 | 0 | 0 | 0 | 0 | 0 | 1 | (7.2) | 6.510 |
| 0 | 0 | 1 | 0 | 0 | 0 | 1 | 6.100 | 3.150 |
| 0 | 1 | 0 | 0 | 0 | 0 | 1 | 3.052 | 2.078 |
| 0 | 1 | 1 | 0 | 0 | 0 | 1 | 2.035 | 1.550 |
| 1 | 0 | 0 | 0 | 0 | 1 | 2 | 3.052 | 2.472 |
| 1 | 0 | 1 | 0 | 0 | 1 | 2 | 2.442 | 2.056 |
| 1 | 1 | 0 | 0 | 0 | 1 | 2 | 2.034 | 1.760 |
| 1 | 1 | 1 | 0 | 0 | 1 | 2 | 1.744 | 1.538 |
| (Mode 2, AB = 10) | | | | | | | | |
| 0 | 0 | 0 | 0 | 0 | 0 | 1 | (7.2) | 6.510 |
| 0 | 0 | 1 | 0 | 0 | 0 | 1 | 6.100 | 3.150 |
| 0 | 1 | 0 | 0 | 0 | 1 | 2 | 6.104 | 4.156 |
| 0 | 1 | 1 | 0 | 0 | 1 | 2 | 4.070 | 3.100 |
| 1 | 0 | 0 | 0 | 1 | 0 | 3 | 4.578 | 3.708 |
| 1 | 0 | 1 | 0 | 1 | 0 | 3 | 3.663 | 3.084 |
| 1 | 1 | 0 | 0 | 1 | 1 | 4 | 4.068 | 3.520 |
| 1 | 1 | 1 | 0 | 1 | 1 | 4 | 3.488 | 3.076 |
| (Mode 3, AB = 11) | | | | | | | | |
| 0 | 0 | 0 | 0 | 0 | 0 | 1 | (7.2) | 6.510 |
| 0 | 0 | 1 | 0 | 0 | 1 | 2 | 12.200 | 6.300 |
| 0 | 1 | 0 | 0 | 1 | 0 | 3 | 9.156 | 6.234 |
| 0 | 1 | 1 | 0 | 1 | 1 | 4 | 8.140 | 6.200 |
| 1 | 0 | 0 | 1 | 0 | 0 | 5 | 7.630 | 6.180 |
| 1 | 0 | 1 | 1 | 0 | 1 | 6 | 7.326 | 6.168 |
| 1 | 1 | 0 | 1 | 1 | 0 | 7 | 7.119 | 6.160 |
| 1 | 1 | 1 | 1 | 1 | 1 | 8 | 6.976 | 6.152 |

While the present invention has been described in connection with preferred embodiments thereof, it is to be understood that additioanl embodiments, modifications and applications will become apparent to those skilled in the art. One such embodiment of the invention is to use a 2x CLK REF frequency input to provide additional clocking edges and dividing by two to obtain CLK REF. This can eliminate the delay elements 24 and 34 described in FIG. 3 and allow a slightly simpler 180 degree inhibit circuit. Accordingly, all of the aforementioned are included in the spirit and scope of the invention as set forth by the claims appended hereto.

I claim:

1. A high resolution digital phase-lock loop circuit comprising:
   digital phase correction means, having as an input thereto a clock reference signal with a frequency (f+df) and a clock output (f), where (f+df) and (f) are appropriately equal;
   divide by K circuit means for dividing said output clock (f) by an integer K to derive a data receive clock phase-locked to incoming data transitions;
   phase detector means having said data receive clock and said incoming data coupled thereto for generating a phase retard signal whenever said data receive clock is early relative to said incoming data transition, and for coupling said phase retard signal to said digital phase correction means to introduce a fixed delay in said clock output frequency (f);
   wherein said digital phase correction means comprises:
   a digital delay line means for providing an incremental delay of from zero to 360 degrees of the period of said clock reference signal;
   shift register means for selecting a desired delay from said delay line; and
   clock correction control means for controlling said shift register means in accordance with said phase retard signal to select a desired incremental delay from said delay line.

2. A high resolution digital phase-lock loop circuit in accordance with claim 1 wherein;
   each increment of said incremental delay is an integer multiple of the propagation delay of a logic gate circuit in said digital delay line.

3. A high resolution digital phase-lock loop circuit in accordance with claim 2, wherein;
   the smallest incremental delay is the propagation delay of two serially connected NAND gates.

4. A high resolution digital phase-lock loop circuit in accordance with claim 3 wherein;
   the number of said smallest incremental delays is selectable from 0 to n, where n is greater than the clock reference signal period divided by said smallest incremental delay.

5. A high resolution digital phase-lock loop circuit in accordance with claim 4 wherein said digital delay line provides an actual delay of up to one period of said clock reference signal, whereby substantially continuous phase retard signals generate a clock output (f) having a lower frequency than said clock reference signal (f+Δf), and a peak jitter of approximately the jitter of said smallest incremental selectable delay element.

6. A high resolution digital phase-lock loop circuit in accordance with claim 3, wherein said incremental gates are implemented in CMOS technology and wherein said smallest incremental delay is approximately 4 nsec on 2-micron CMOS.

7. A high resolution digital phase-lock loop circuit in accordance with claim 2 wherein the data outputs of said shift register means select the number of increments of delay on said digital delay line.

8. A high resolution digital phase-lock loop circuit in accordance with claim 2 wherein each of said logic gate circuits is a data selector and wherein the propagation delay time of said data selectors in a serial chain provides a variable delay.

9. A high resolution digital phase-lock loop circuit in accordance with claim 1 further comprising:

phase detect circuit means for generating an initialization signal for resetting said digital delay line to zero when said clock output (f) is phase retarded by 360 degrees, such that said digital delay line provides an apparent infinite delay line.

10. A high resolution digital phase-lock loop circuit in accordance with claim 1, further comprising:
a buffer amplifier means for driving said digital delay line.

11. A high resolution digital phase-lock loop circuit in accordance with claim 1 wherein said phase detector means comprises:
positive edge detector circuit means; and
inhibit circuit means for inhibiting false detection of 360 degrees of phase shift.

12. A high resolution digital phase-lock loop circuit in accordance with claim 1 wherein said incoming data is in the form of 2BlQ data.

13. A high resolution digital phase-lock loop circuit in accordance with claim 12, wherein said incoming data is in the form of Manchester encoded data which is coupled to said phase detector means, said phase detector including:
means for centering the negative edge of a receive clock input between incoming data transistions.

14. A high resolution digital phase-lock loop circuit in accordance with claim 13, wherein said means for centering the negative edge of said receive clock comprises:
a pair of flip-flop circuits for sampling the positive and negative edges of said receive clock, respectively, and for generating an output signal from each of said flip-flop circuits;
means for detecting whether said output signals are different, and for generating a transition indicating signal indicative of whether said outputs signals are different; and
means for sampling said transition indicating signal to generate a phase retardation signal incrementally until said difference is no longer indicated.

15. A high resolution digital phase-lock loop circuit in accordance with claim 1 wherein said clock correction control circuit includes gate delay compensation means.

16. A high resolution digital phase-lock loop circuit in accordance with claim 15, wherein said gate delay compensation means includes:
up/down retard counter means for holding the average number of shift clocks required from 0 to 360 degrees of delay;
means for comparing the count of said counter to a phase retard actual count just prior to intialization of said shift register, and incrementing said up/down retard counter means when said actual count is greater than the average count.

17. A high resolution digital phase-lock loop circuit in accordance with claim 15, further including:
mode control circuit for implementing a binary division to progammably shift a predetermined amount of said shift register delay per increment.

18. A high resolution digital phase-lock loop circuit in accordance with claim 1 wherein $\Delta F$ is approximately less than ten percent of df.

19. A high resolution digital phase-lock loop circuit in accordance with claim 1 wherein said digital delay line includes means for providing delay as a programmable percentage of the average phase retard count.

* * * * *